(12) United States Patent
Ikeda et al.

(10) Patent No.: US 6,281,026 B1
(45) Date of Patent: Aug. 28, 2001

(54) SEMICONDUCTOR DEVICE AND METHOD FOR MANUFACTURING THE SAME

(75) Inventors: Kouichi Ikeda, Niigata; Takeshi Ikeda, Tokyo, both of (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 09/554,418
(22) PCT Filed: Feb. 27, 1998
(86) PCT No.: PCT/JP98/00811
§ 371 Date: May 11, 2000
§ 102(e) Date: May 11, 2000
(87) PCT Pub. No.: WO99/26288
PCT Pub. Date: May 27, 1999

(30) Foreign Application Priority Data

Nov. 14, 1997 (JP) .................................................. 9-331206

(51) Int. Cl.⁷ .................................................... H01L 21/66
(52) U.S. Cl. ................................ 438/14; 438/20; 438/110; 324/754; 324/765; 257/676; 29/842
(58) Field of Search ................................. 438/14, 20, 110; 324/754, 765; 257/676; 29/842

(56) References Cited

U.S. PATENT DOCUMENTS

| | | | |
|---|---|---|---|
| 5,391,916 | * | 2/1995 | Kohmo et al. ........................ 257/676 |
| 5,829,126 | * | 11/1998 | Nagao et al. ........................... 29/843 |
| 6,040,706 | * | 3/2000 | Tsuura .................................. 324/765 |
| 6,084,419 | * | 7/2000 | Sato et al. ............................. 324/754 |

FOREIGN PATENT DOCUMENTS 6-61417    3/1994    (JP) .

\* cited by examiner

*Primary Examiner*—Richard Elms
*Assistant Examiner*—Pho Luu
(74) *Attorney, Agent, or Firm*—Dellett and Walters

(57) ABSTRACT

A semiconductor device which is mounted with a plurality of semiconductor chips. The fraction defective is low when the device is manufactured, and the efficiency of inspection is high. A method for manufacturing such a semiconductor device is also disclosed. A plurality of identical bare chips 1 for memory are COB-mounted on a substrate 2, and the surface of the substrate 2 mounted with the chips 1 is encapsulated with a resin 3. Then all the chips 1 mounted on the substrate 2 are inspected at once. Four-chip, two-chip, and one-chip memory modules 10 are produced by cutting the substrate 2 and combining bare chips 1 which are judged to be nondefective chips.

4 Claims, 6 Drawing Sheets

SEMICONDUCTOR DEVICE AND METHOD FOR MANUFACTURING THE SAME

TECHNICAL FIELD

The present invention relates to a semiconductor device that is implementable on a memory substrate, a mother board or the like, and a method for manufacturing the same.

BACKGROUND ART

A conventional semiconductor memory is assembled in a packaged condition. In addition, replacing respective chips of the multichip module to a memory chip is also possible; however, causes increase in a defect rate in overall the module by accumulating the defect rate of respective chips. For example, in the case where four memory chips are implemented on a single module substrate, only one defect memory chip causes overall defect of the module. Therefore, it is necessary handling to replace the defect memory chip as a repairing work and discard the overall module as a defect product. Thus, a low yield and a low efficiency occur.

Quality inspection is simultaneously carried out in every unit of one or a plurality of the packed memory chip and the memory chip implemented on the module substrate. However, in the case where the total number of memory chips to inspect is too many, a small number of memory chips handlable by a single inspection decreases inspecting efficiency. Therefore, a method is desired to increase the inspection efficiency.

The memory chip described as above can be corresponded to a general semiconductor chip, as it is.

DISCLOSURE OF THE INVENTION

The present invention has been created in consideration of such point and has an object is to provide a semiconductor device and a method for manufacturing the same that can reduce defect rate in manufacturing the semiconductor device on which a plurality of semiconductor chips is implemented and can improve efficiency of inspection of respective semiconductor chips.

According to the present invention, the semiconductor device is formed by dividing semiconductor chips in a unit of one or a plurality according to the result of quality inspection of respective semiconductor chips after implementation of a plurality of identical semiconductor chips (preferably memory chips) on the substrate to seal in a resin. Dividing semiconductor chips is carried out according to the result of quality inspection. When the semiconductor substrate comprising a plurality of semiconductor chips is manufactured, a defective part of semiconductor chips does not cause defect of overall semiconductor device. Thus, the defect rate in manufacturing the semiconductor device can be reduced. The semiconductor chip inspected for every substrate unit allows increase in inspection efficiency in comparison with inspection for individual one or a few semiconductor chips.

Particularly, it is preferable that a plurality of semiconductor chips is implemented on one surface of the substrate and respective semiconductor chips are inspected through a terminal formed on the other surface. In this case, the overall one substrate can be handled as one part to inspect a plurality of semiconductor chips implemented on the substrate. Thus, time for inspection can be reduced in comparison with the case where the inspection is carried out in a unit of the memory modules on which memories individually packed and a plurality of memory chips are implemented.

It is preferable that semiconductor chips, particularly memory chips, according to the result of quality inspection are divided in every group made of four pieces if four is possible to handle, every two pieces if four is impossible but two are possible to handle, and every one piece if two are impossible to handle. As described above, priority of dividing in a group of a plurality of pieces makes efficient manufacture of the semiconductor device of the large (for four pieces) unit possible.

DESCRIPTION OF THE DRAWINGS

FIGS. 1(a) through 7(d) are figures showing a manufacturing process for a memory module of embodiments of the present invention;

FIG. 5 is a figure showing a condition in which the memory bare chip is connected to the substrate in case of the flip chip implementation;

FIG. 6 is a figure showing sectional views of the memory bare chip and the substrate, which make a CIB structure;

BEST MODE FOR CARRYING OUT THE INVENTION

The memory module of an embodiment according to the present invention is specifically described below with reference to the drawings. FIG. 1 is a figure showing a manufacturing step for a memory module of embodiments of the present invention. As shown in the FIG. 1(d) the memory module 10 (10a, 10b, and 10c) as the semiconductor device is configured by including the bare chip (memory chip) 1 divided from a semiconductor wafer for memory, the substrate 2 on which the memory bare chip 1 is implemented, and the resin 3 to seal a surface on which the memory bare chip 1 of the substrate 2 is implemented.

Figure 1A:
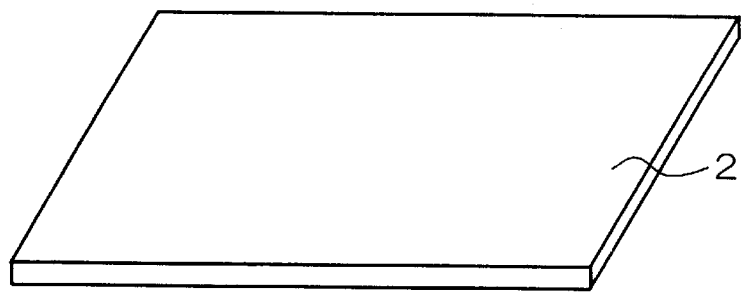
Figure 1B:
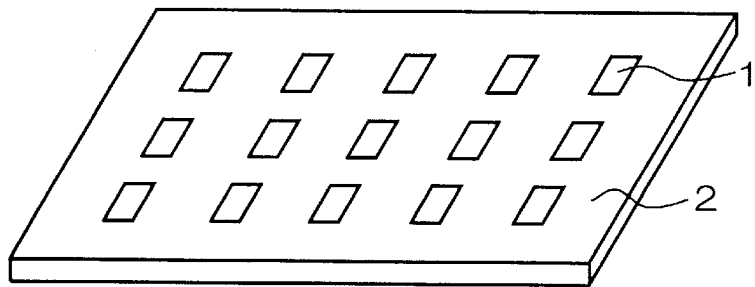
Figure 1C:
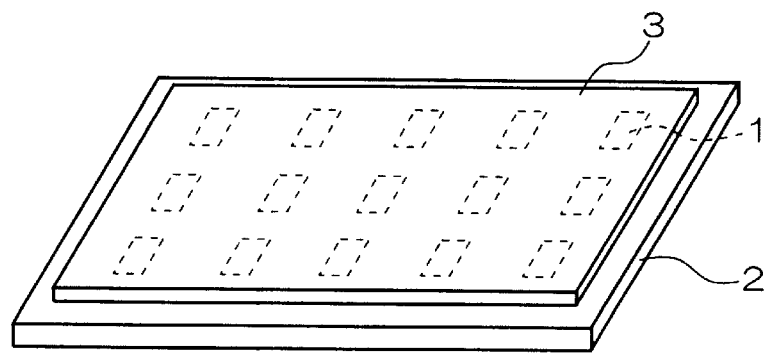

As shown in the FIGS. 1(a) and 1(b), the substrate is first introduced and on this substrate 2, a plurality of memory bare chips 1 are implemented by arranging on the one surface with a given longitudinal and transverse distance (the first step). As the implementing method of respective memory bare chips 1, for example, COB (Chip On Board) implementation is applied.

Figure 2A:
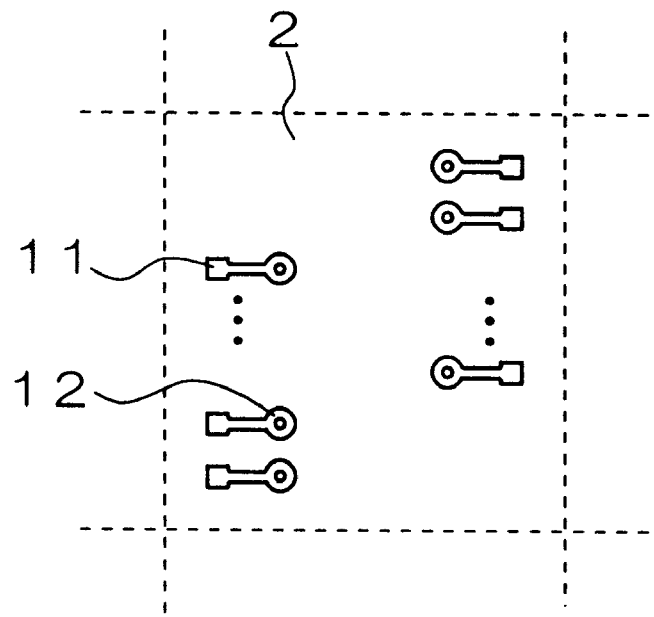
FIGS. 2(a) through 2(c) are figures showing a partial structure of a substrate before implementation of a memory bare chip.
Figure 2B:
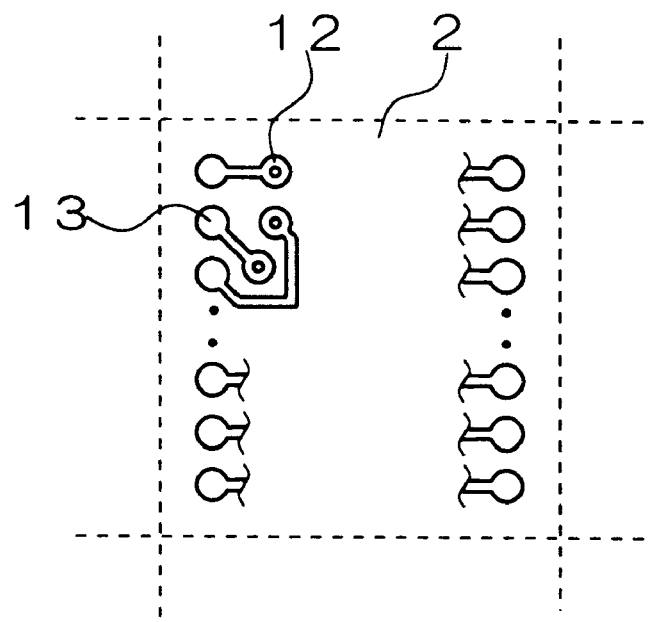
Figure 2C:
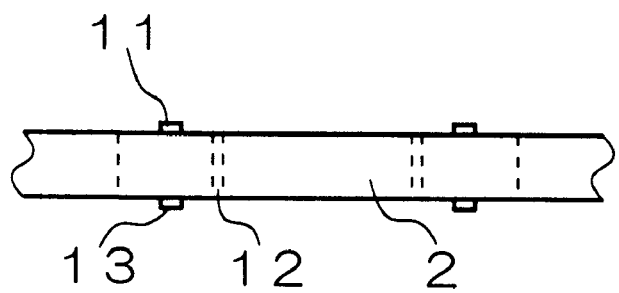

FIG. 2 is a figure showing a partial structure of a substrate 2 before implementation of the memory bare chip 1. The FIG. 2(a), the FIG. 2(b), and the FIG. 2(c) represent a surface of the side on which the memory bare chip 1 is implemented, the surface of the opposite side (reverse surface), and the structure in side view, respectively. As shown in these figures, on the substrate 2, a substrate pad 11 necessary for an electric connection to the memory bare chip 1 is formed for the given every regions on which the memory bare chip 1 is implemented. This substrate pad 11 is electrically connected to a BGA (Ball Grid Array) pad 13 on the reverse side via a through hole 12.

Figure 3A:
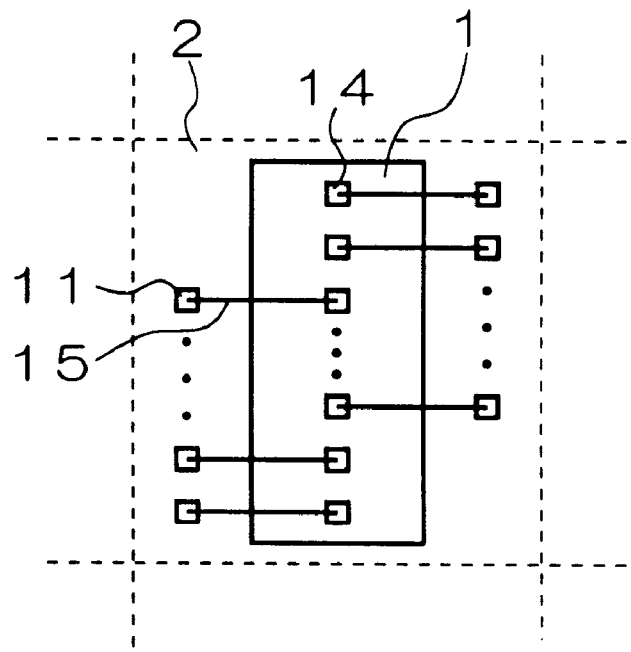
FIGS. 3(a) and 3(b) are figures showing a condition in which the memory bare chip is implemented on the substrate shown in FIG. 2(a), FIG. 2(b) and FIG. 2(c)
Figure 3B:
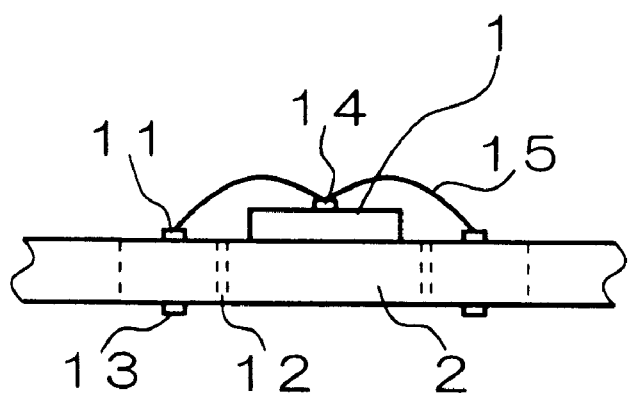

FIG. 3 is a figure showing a condition in which the memory bare chip 1 is implemented on the substrate 2, shown in the FIG. 2, in the first step. The FIGS. 3(a) and 3(b) show the implementing surface of memory bare chip 1 and the structure in side view, respectively. Respective memory bare chip 1 are DRAMs having a capacity of 16 M×4 bits, for example and a line of chip pads 14 is formed in the center along with the longer side of the surface thereof. The chip pads 14 are connected to a substrate pad 11 formed on the substrate 2 by using a bonding wire 15. The COB implementation is carried out for respective memory bare chip 1 by using such bonding wire 15.

After implementation of the memory bare chips 1 on the substrate 2 in the first step as described above, as shown in the FIG. 1(c), the resin 3 is poured into the surface on which the memory bare chips 1 of the substrate 2 has been implemented to seal respective memory bare chips 1 with the resin 3 of a given thickness (the second step).

The second step is to realize prevention of break and short of the bonding wire 15 connected to memory bare chips 1 by sealing respective memory bare chips 1 with the resin 3. In addition, the given thickness of the resin 3 reduces irregularity of heights of the memory modules 10 manufactured.

Subsequently, in the condition in which sealing has been carried out with the resin 3 by such way, respective memory bare chips 1 are inspected for quality (the third step). For example, various function tests are carried out by pressing an inspection probe to the BGA pad 13 that is formed on the reverse surface of the substrate 2, to contact electrically. Inspection efficiency is increased by inspecting memory bare chips 1 in the unit of overall substrate 2; in other words, by a single inspection for a plurality of memory bare chips 1, that is implemented on the substrate 2.

Figure 1D:
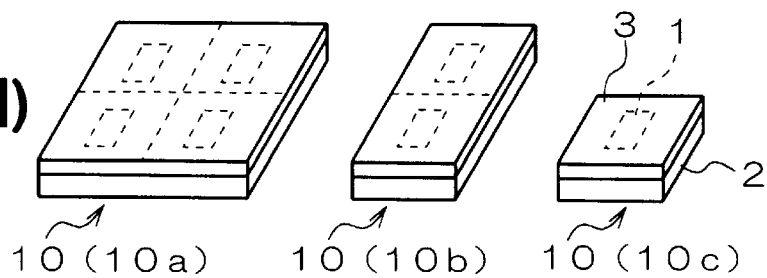

Next, on the basis of the result of inspection in the third step, as shown in the FIG. 1(d), any one of the memory module 10a made of four-piece memory chips, the memory module 10b made of two piece memory chips, and the memory module 10c made of one memory chip are completed (the fourth step) by dividing memory bare chips 1, that have been determined good, in a single or a group of plural pieces (two or four pieces).

Figure 4A:
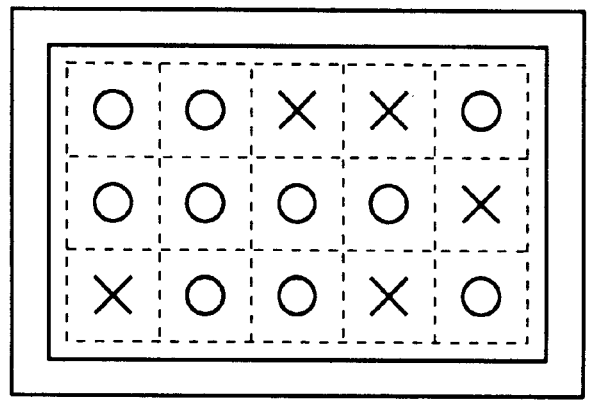
FIGS. 4(a) and 4(b) are figures showing an example of a method for dividing the memory bare chip implemented on the substrate.
Figure 4B:
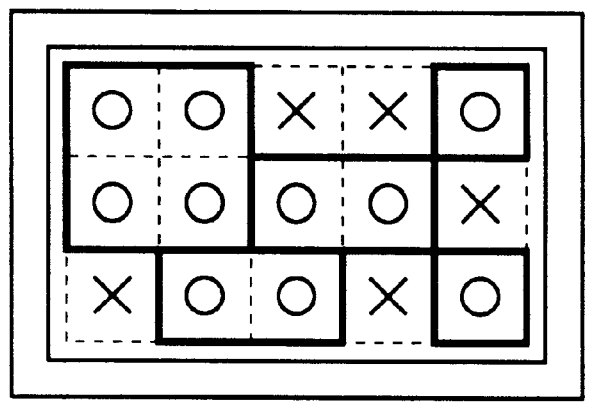

FIG. 4 is a figure showing an example of a method for dividing the memory bare chip implemented on the substrate 2. FIG. 4(a) is a figure showing the result of inspection in the third step described above. In this figure, a mark ○ represents memory bare chips determined good and a mark × represents memory bare chips determined defective pieces. FIG. 4(b) is a figure showing a dividing manner for memory bare chips judged to be nondefective. A region surrounded by a bold line shows the unit of division.

As described above, memory bare chips 1 are divided in a unit of a group made of one or a plurality of pieces (two or four pieces). Preferably, dividing is simultaneously carried out for a group made of pieces as many as possible. Therefore, the processes according to the dividing method shown in the FIG. 4(b) are as follows: four pieces are divided in the case where four memory bare chips 1 can be divided as a unit, two pieces are divided as a unit in the case where four memory bare chips 1 cannot be divided, and one piece is divided in the case where two memory bare chips 1 cannot be divided. In the case where this dividing method is applied to the result of inspection shown in the FIG. 4(a), one memory module 10a for four-piece division, two memory modules 10b for two-piece division, two memory modules 10c for one-piece division can be respectively manufactured.

When bit configuration of respective memory bare chips 1 is 16 M×4 bits, for example, the memory module 10a containing four memory bare chips 1 can be used as memory device of any one of 16 M×16 bits, 32 M×8 bits, and 64 M×4 bits according to wiring manner on the substrate (not illustrated) on which the memory module 10a is implemented. Particularly, the memory module 10a after sealing can be handled as same as a single memory device. Therefore, processes of implementing on other substrates can be simplified. In addition, the memory module 10a can be formed in a minimum size necessary for implementation of four memory bare chips 1 to make miniaturization of parts possible.

Similarly, when bit configuration of respective memory bare chips 1 is 16 M×4 bits, the memory module 10a containing two memory bare chips 1 can be used as memory device of any one of 16 M×8 bits and 32 M×4 bits according to wiring manner on the substrate on which the memory module 10b is implemented. Particularly, the memory module 10b after sealing can be handled as same as a single memory device. Therefore, processes of implementing on other substrates can be simplified and parts can be miniaturized.

As described above, manufacture of the memory module 10 is carried out by implementing a plurality of memory bare chips 1 on the substrate 2 and dividing only those, among these memory bare chips 1, judged to be nondefective by quality inspection. Therefore, a defect part of memory bare chips 1 does not cause defect product of overall memory module 10 to allow reducing the defect rate in manufacture of the memory module 10.

Quality inspection of a plurality of memory bare chips 1, which is implemented on the substrate 2, is simultaneously carried out in a unit of overall substrate 2 as a single group. Therefore inspection efficiency can be improved. Furthermore, memory bare chips are divided in a unit of a group made of one or a plurality of pieces (two or four pieces). Preferably, dividing is simultaneously carried out for a group made of pieces as many as possible. Namely, dividing for four pieces as a group as possible allows efficient manufacture of the memory module 10a for four pieces as a group.

Figure 5:
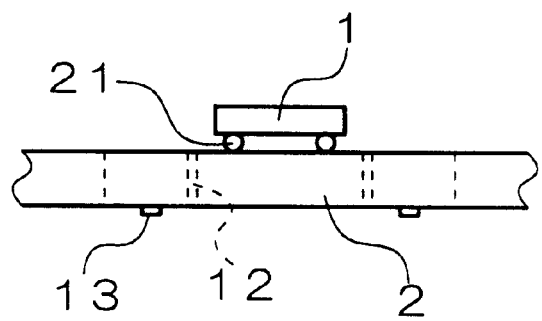

The present invention is not restricted to the embodiments described above and can be carried out by various modifications in a range of the scope of the present invention. Wire bonding implementation was carried out in the embodiments as described above, however, for example, the memory bare chips 1 may be implemented by the flip chip implementation. FIG. 5 is a figure showing a condition in which the memory bare chip 1 is connected to the substrate 2 in case of the flip chip implementation. As shown in the figure, the flip chip implementation is carried out by arranging the substrate pad formed on a implementation surface of the memory bare chip 1 and the chip pad formed on the surface of the substrate 2, on which the memory bare chip 1 is implemented, in an opposite position to connect each other by a bump 21. The flip chip implementation allows high density implementation. Thus, the external size of the memory module 10 to be manufactured can be further miniaturized. In various semiconductor chips including DRAM in the future, the length of wire is preferable as short as possible to allow a high speed operation. The shorter wiring length can be realized by adopting the flip chip implementation.

Figure 6:
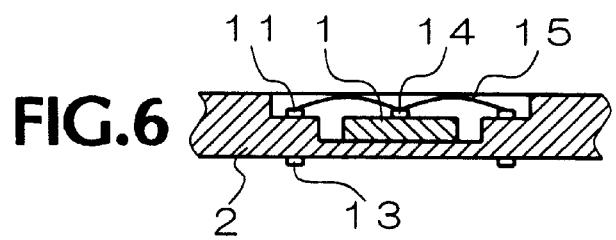

In the embodiment described above, respective memory bare chips 1 and a bonding wire 15 project out on the substrate 2, because respective memory bare chips 1 is mounted on the substrate 2 and the COB implementation was carried out thereon. CIB (Chip In Board) structure, in which the bonding wire 15 or the like does not project to outside, is possible by containing respective memory bare chips 1 in the substrate 2. FIG. 6 is a figure showing sectional views of the memory bare chip 1 and the substrate 2, which make a CIB structure. As shown in the figure, vertical movement of capillary of a wire bonding device can be decreased in implementation to make improvement of working efficiency possible by forming a recess on the substrate 2, implementing the memory bare chips 1 inside the recess, and arranging the substrate pad 11 and the chip pad 14 on an almost same surface. In addition, the bonding wire 15 does not contact with the end of the memory bare chips 1 and wires do not short in this portion to make decrease in defect rate possible.

Figure 7A:
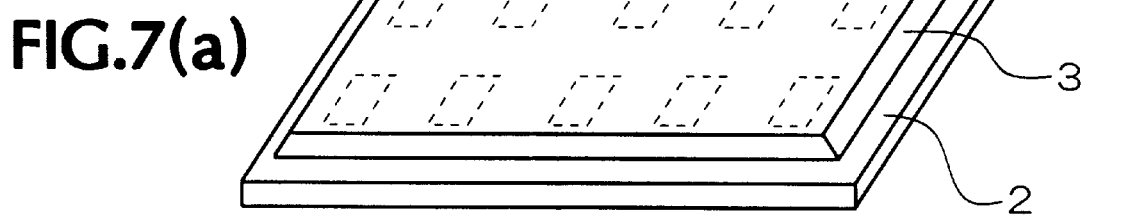
FIGS. 7(a) and 7(b) are figures illustrating an outline of resin molding by a transfer mold.
Figure 7B:
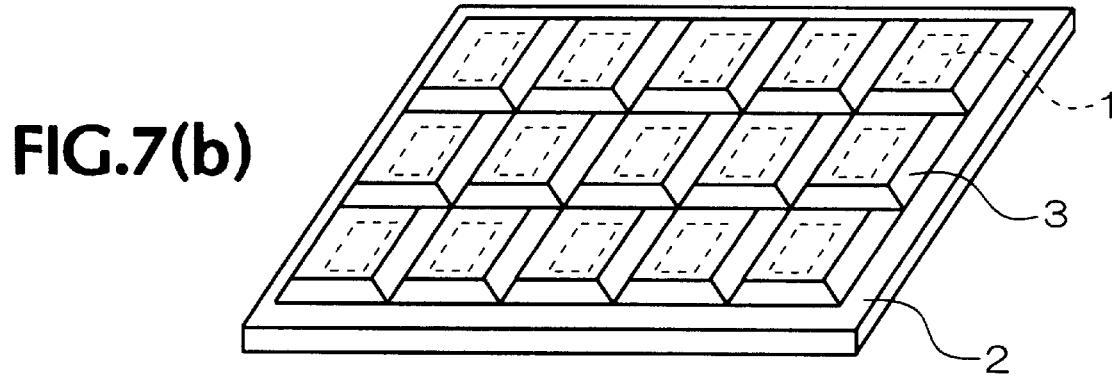

In the embodiment described above, the resin 3 is simply poured to seal the surface of the substrate 2 on which memory bare chips 1 are implemented. However, resin sealing may be carried out with a transfer mold by injection molding. FIG. 7 is a figure illustrating an outline of resin molding by the transfer mold. FIG. 7(a) shows the case where flat resin is formed on entire substrate 2 and 7(b) is a modification of the FIG. 7A and shows the case where a groove is formed by dividing line. The resin formation with transfer mold allows shortening of a molding time and suitable for mass production.

In the embodiment described above, a BGA pad 13 is used as the external connecting terminal of the memory module 10. However, the terminal of so-called LCC (Leadless Chip Carrier) system may be used.

Figure 8:
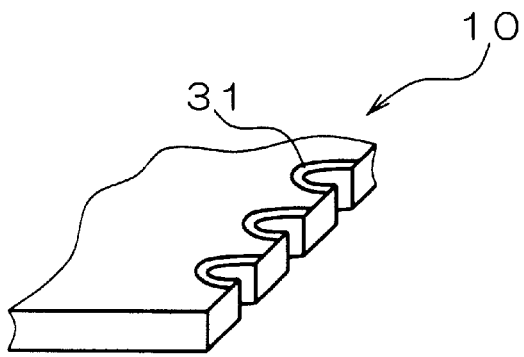
FIG. 8 is a figure showing a partial structure of a memory module in case of using an external connecting terminal of LCC system.

FIG. 8 is a figure showing a partial structure of a memory module 10 in case of using an external connecting terminal of LCC system. As shown in the figure, the recess is formed in any one direction (or both direction) of a longitudinal direction and a transverse direction among side surfaces of the memory module 10 after dividing. The external connecting terminal 31 is formed to cover the surface of the recess by metal plating.

Figure 9A:
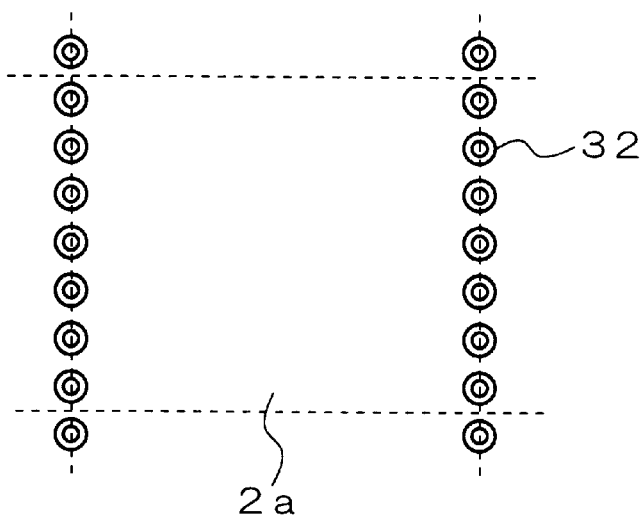
FIGS. 9(a) and 9(b) are figures showing illustrating a procedure of forming the external connecting terminal in case of using the external connecting terminal of LCC system.
Figure 9B:
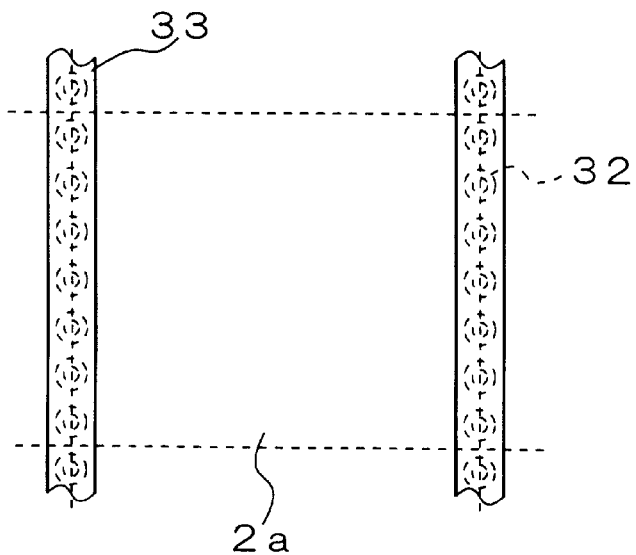

FIG. 9 is a figure showing illustrating a procedure of forming the external connecting terminal 31 in case of using the external connecting terminal of LCC system. As shown in the FIG. 9(a), a through hole 32 is formed on the substrate 2a along with any one (or both) of the longitudinal direction and the transverse direction among dividing lines to divide the memory bare chip 1 implemented. However, in using the substrate 2a for manufacture of the memory module 10 as it is, clogging of the external connecting terminal 31 may cause by the resin 3 which is poured in resin sealing in the second manufacturing step described above. Therefore, as shown in the FIG. 9B, a protecting member such as an insulating tape 33 is formed along with the through hole 32 to prevent pouring of the resin 3 in the through hole 32. Or, solder may be poured in the through hole 32 to prevent clogging caused by the resin. Subsequently, the through hole 32 described above is cut in its center to form the external connecting terminal 31 as shown in the FIG. 8.

The bit configuration of respective the memory bare chip 1 is assumed 16 M×4 bits in the embodiment described above, other bit configuration is possible. Besides, a combination of different bit configurations or memory bare chips with different capacities is possible. As the substrate 2 used in the embodiment described above, a flexible substrate or other various substrate may be used. In the embodiment described above, the case described is of an example in that the memory chip is used for the semiconductor chip to manufacture the memory module as the semiconductor device. This example can be applied to the case where the semiconductor chip of various chips other than the memory chip, for example, a processor chip and ASIC, is implemented on the substrate.

In those cases, different kinds of two chips may be combined. More different kinds of chips (e.g., four) may be combined. In this case, it is not necessary that all chips differ from each other and it is satisfactory that at least two kinds of chips are combined.

Industrial Applicability

As described above, according to the present invention, dividing semiconductor chips is carried out according to the result of quality inspection. Therefore, a defective part of semiconductor chips contained in the semiconductor device does not cause defect of overall semiconductor device. Thus, the defect rate in manufacturing the semiconductor device can be reduced. In addition, the semiconductor chip inspected for every overall substrate unit allows improving an efficiency of inspection in comparison with inspection for individual one or a few semiconductor chips.

Especially, semiconductor chips, particularly memory chips, according to the result of quality inspection are divided in every group made of four pieces if four pieces is possible to handle and every two pieces if four pieces is impossible but two pieces are possible to handle. Thus, the most efficient manufacture of the semiconductor device of four-piece unit becomes possible.

What is claimed is:

1. A method for manufacturing the semiconductor device, comprising:

a first step of implementing a plurality of identical semiconductor chips on a substrate, a second step of sealing said substrate of said plurality of identical semiconductor chips with a resin, a third step for quality inspection said respective semiconductor chips, and a fourth step of dividing one or a plurality of said semiconductor chips from others of said semiconductor chips on the substrate into a group on the basis of the result of said inspection.

2. The method for manufacturing the semiconductor device according to claim 1, wherein:

a first subset of said plurality of said semiconductor chips implemented in said first step is formed on a first surface of said substrate; and said quality inspection in said third step is carried out through a terminal corresponding to a second subset of said plurality of said semiconductor chips formed on a second surface of said substrate.

3. The method for manufacturing the semiconductor device according to claim 1, wherein said semiconductor chips are memory chips.

4. The method for manufacturing the semiconductor device according to claim 3, wherein said plurality of semiconductor chips in said fourth step are divided into a group made of four of said identical semiconductor chips if four of said semiconductor chips are acceptable as a result of said inspection, wherein said plurality of semiconductor chips in said fourth step are divided into a group made of two of said identical semiconductor chips if four are not acceptable as a result of said inspection but two are acceptable, and wherein said plurality of semiconductor chips in said fourth step are divided into individual single semiconductor chips if two are not acceptable as a result of said inspection.

* * * * *